United States Patent
Hartnett

(10) Patent No.: US 6,427,217 B1
(45) Date of Patent: *Jul. 30, 2002

(54) SYSTEM AND METHOD FOR SCAN ASSISTED SELF-TEST OF INTEGRATED CIRCUITS

(75) Inventor: Frederick J. Hartnett, Plano, TX (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/292,717

(22) Filed: Apr. 15, 1999

(51) Int. Cl.[7] ............................................. G01R 31/28
(52) U.S. Cl. .................... 714/733; 714/726; 714/729
(58) Field of Search ................. 714/729, 727, 714/726, 724, 733; 395/183.06; 716/18

(56) References Cited

U.S. PATENT DOCUMENTS

| | | | | |
|---|---|---|---|---|
| 5,570,375 A | * | 10/1996 | Tsai et al. ................... | 714/727 |
| 5,592,493 A | * | 1/1997 | Crouch et al. .............. | 714/729 |
| 5,862,152 A | * | 1/1999 | Handly et al. .............. | 714/727 |
| 6,028,983 A | * | 2/2000 | Jaber ..................... | 395/183.06 |
| 6,106,568 A | * | 8/2000 | Beausang et al. ............. | 716/18 |
| 6,158,032 A | * | 12/2000 | Currier et al. .............. | 714/726 |

\* cited by examiner

Primary Examiner—David Ton
(74) Attorney, Agent, or Firm—Alexander Neudeck

(57) ABSTRACT

A system and method for testing an integrated circuit (IC) by using a boundary scan ring having registers coupled to a functional scan ring having registers within the integrated circuit in order to maximize test coverage, while minimizing test time. This is accomplished by shifting the boundary scan registers according to a clock signal while supplying data to the functional scan registers. The functional scan registers also supply data to the boundary scan registers. By appropriately interleaving input and output registers of the boundary scan ring, random data is supplied to the functional scan registers. This data may be scanned out of the boundary scan registers and compared with previously established test vectors in order to determine whether the device is performing as designed. Data may also be scanned out of the functional scan registers to augment the test coverage.

24 Claims, 4 Drawing Sheets

SYSTEM AND METHOD FOR SCAN ASSISTED SELF-TEST OF INTEGRATED CIRCUITS

TECHNICAL FIELD

The present invention relates generally to integrated circuit testing, and, more particularly, to a system and method for integrated circuit (IC) device testing assisted by scan.

BACKGROUND OF THE INVENTION

Typically, in the past, integrated circuit (IC) devices have been tested and verified using a combination of test methods. For example, IC devices were originally tested and verified to be defect free using functional test vectors, which stimulate and verify the device functionality at the pin level only. While this approach provides relatively short test times, it is typically ineffective for detecting faults deep within today's large and complex IC devices.

As a way of augmenting functional test vector analysis, scan testing of IC devices was introduced. Scan testing allows access to the internal registers of an IC device, providing much higher fault coverage than that attainable by functional test vector testing. However, scan testing greatly extends test time.

Still another improvement was attained by the advent of built in self testing (BIST), which provides lower test times than scan testing and provides higher test coverage than traditional pin based functional vector testing. Unfortunately, BIST testing typically results in less than 90% fault coverage, which is insufficient to test today's large IC devices.

Another drawback with BIST testing is that BIST specific hardware must be designed into the IC device. Typically, this includes a signature analysis register, which compares the resultant test data against the expected test result. Additionally, a linear feedback shift register (LFSR) is required to provide a fixed sequence of stimulus to the logic under test. The LFSR typically must be designed and redesigned to obtain 85–90% fault coverage. In complex designs, BIST circuitry is typically required for each major functional block of the IC device, thus further increasing the design cycle time and consuming valuable space on the device for the test logic.

Unfortunately, because the BIST testing is hardware specific, it may not be modified to enhance deficiencies in test coverage once the design of the IC device is complete.

Therefore, it would be desirable to improve test coverage of an IC device while minimizing test times, while being able to modify the test logic after the design of the IC device is complete.

SUMMARY OF THE INVENTION

The invention provides a system and method for testing in an integrated circuit.

In architecture, the present invention may be conceptualized as a system for testing an integrated circuit, the integrated circuit including core logic, the system comprising: a boundary scan ring, the boundary scan ring including a plurality of registers; a functional scan ring within the integrated circuit, the functional scan ring including a plurality of registers, the functional scan ring coupled to the boundary scan ring; multiplexer logic configured to control the boundary scan ring such that the boundary scan ring recirculates data within the boundary scan registers; and clock logic configured to shift the boundary scan registers with a clock signal while the functional scan registers capture data supplied by the boundary scan ring, and the boundary scan registers capture data from the functional scan registers.

The present invention may also be conceptualized as a method for testing an integrated circuit, the integrated circuit including core logic and a plurality of functional scan registers coupled to a plurality of boundary scan registers, the method comprising the steps of: establishing a plurality of test vectors; initializing the functional scan registers and the boundary scan registers; clocking the integrated circuit; supplying data input signals from the boundary scan registers to the functional scan registers; receiving in the boundary scan registers data output signals from the functional scan registers; and outputting the data output signals and comparing the data output signals to the test vectors in order to determine whether the data output signals are an accurate representation of the test vectors.

The invention has numerous advantages, a few of which are delineated, hereafter, as merely examples.

An advantage of the invention is that it improves test coverage in an integrated circuit.

An advantage of the invention is that it reduces the amount of time for testing an integrated circuit.

Another advantage of the invention is that it allows for continuously updating the test routine of an integrated circuit.

Another advantage of the invention is that it is simple in design and easily implemented on a mass scale for commercial production.

Another advantage of the invention is that it allows IC testing to be performed at the clock rate at which the IC was designed to operate.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

The invention to be described hereafter is applicable to integrated circuit testing, however, the invention can be employed by any device having two or more scan rings. Furthermore, a device having one scan ring may be modified to employ two scan rings, or an IC device without scan capability may be modified to include scan, which would then enable the IC device to capitalize on the present invention.

Furthermore, for simplicity in the description to follow, only the elements relative to testing the integrated circuit by the present invention will be illustrated.

The device test program of the present invention can be implemented in hardware, software, firmware, or a combination thereof. In the preferred embodiment(s), the device test program is implemented in software or firmware that is stored in a memory and that is executed by a suitable instruction execution system.

The device test program, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program and test vectors for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
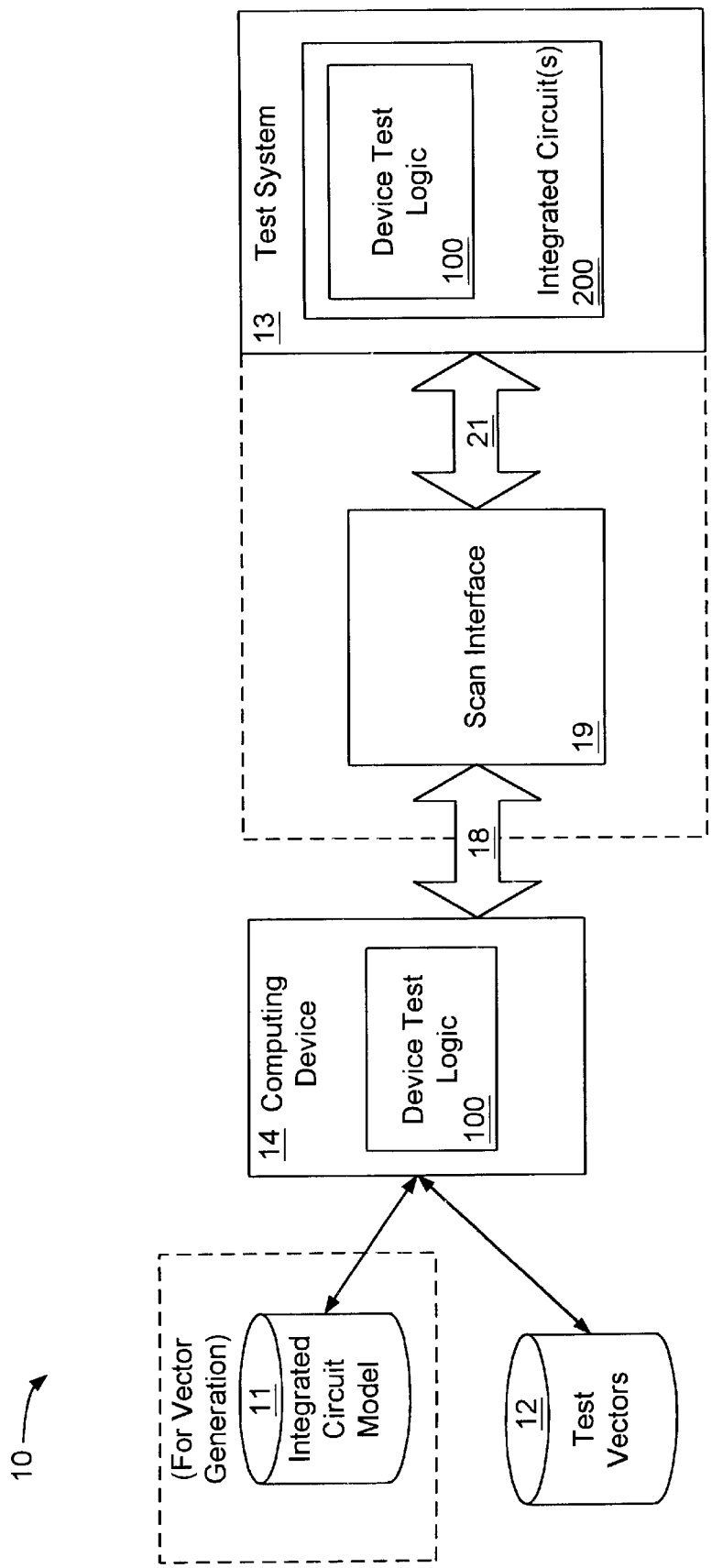
FIG. 1 is a system level block diagram illustrating the environment in which the device test logic of the present invention resides.
Figure 3:
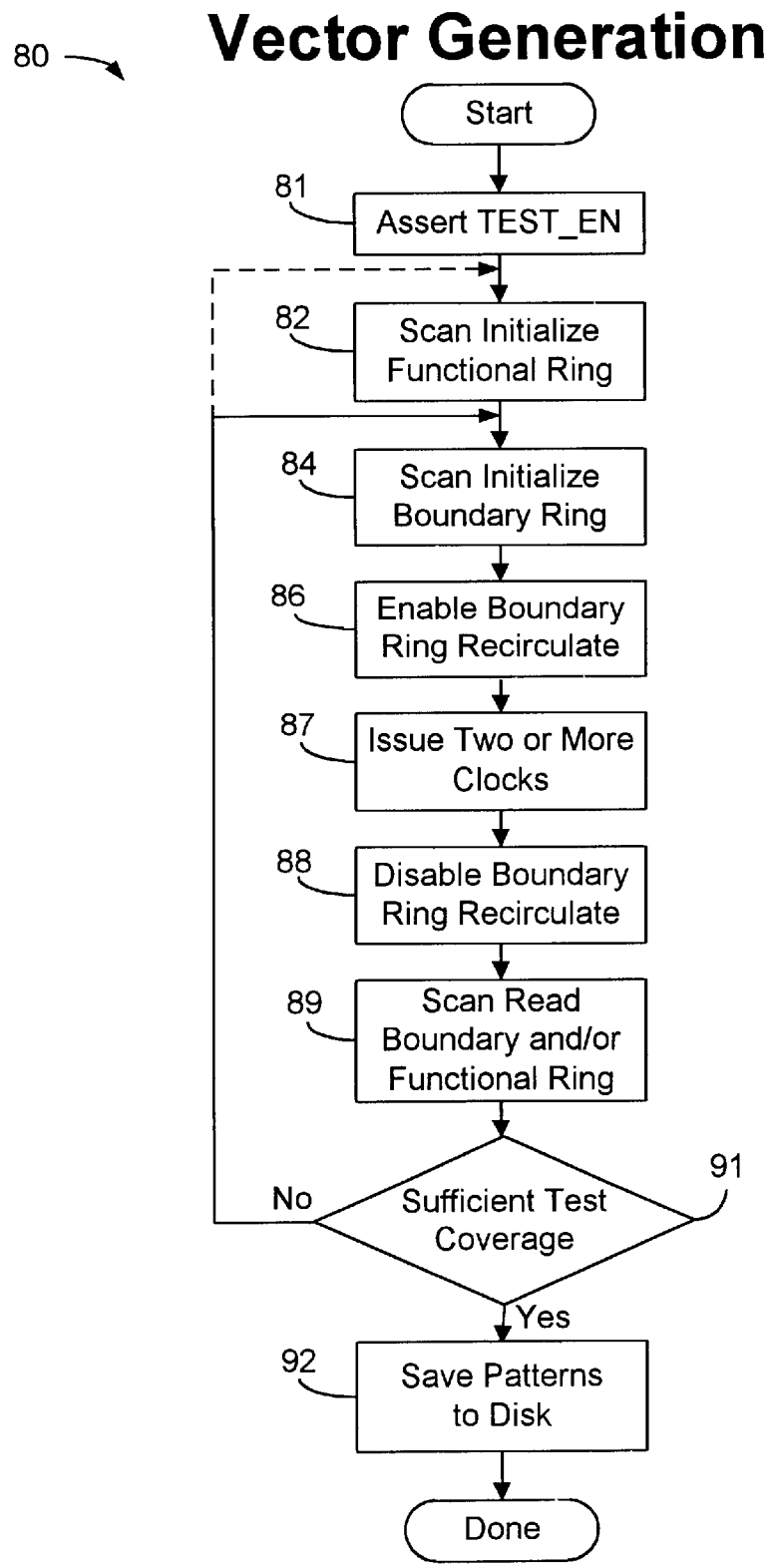
FIG. 3 is a flow chart illustrating the vector generation of the device test logic of FIG. 1.
Figure 4:
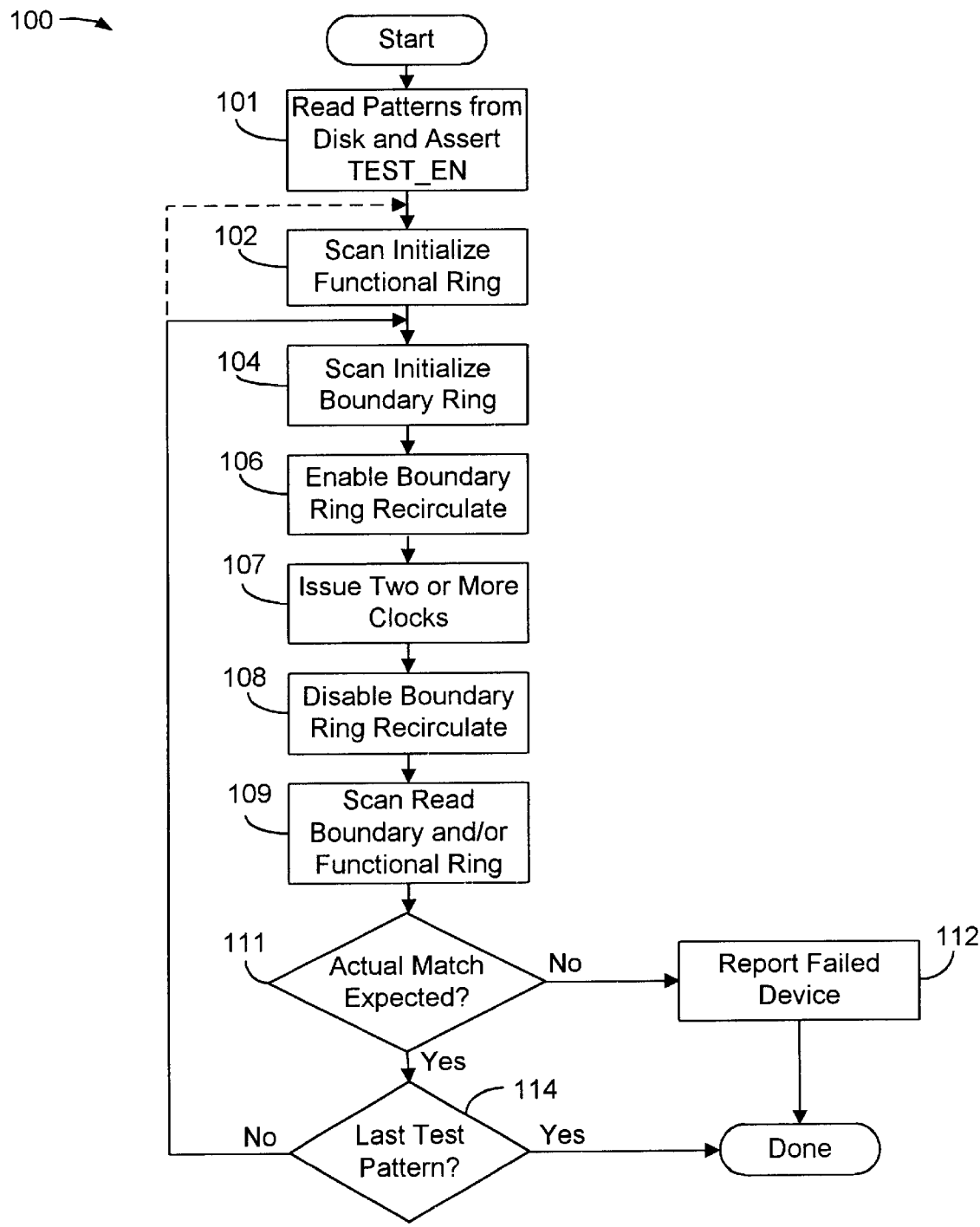
FIG. 4 is a flow chart illustrating the operation of device test logic of FIG. 1.

Furthermore, the flow charts of FIGS. 3 and 4 show the functionality and operation of a possible implementation of the device testing software of FIG. 1. In this regard, each block represents a module, segment, or portion of code, which comprises one or more executable instructions for implementing the specified logical function(s). It should also be noted that in some alternative implementations, the functions noted in the blocks may occur out of the order noted in FIGS. 3 and 4. For example, two blocks shown in succession in FIG. 3 may in fact be executed substantially concurrently or the blocks may sometimes be executed in the reverse order, depending upon the functionality involved, as will be further clarified hereinbelow.

Turning now to the drawings, FIG. 1 is a system level block diagram illustrating the environment 10 in which the device test logic 100 of the present invention resides. Included in environment 10 is integrated circuit model 11, which is one example of a method for generating test vectors which will be used to test integrated circuit 200. Essentially, the information contained within integrated circuit model 11 is a behavioral model which represents the integrated circuit 200 under test. The information contained within integrated circuit model 11 is transferred to computing device 14 over connection 16. Computing device 14 may be a PC, a workstation, or any general purpose computer capable of executing the software that represents an implementation of device test logic 100.

Alternatively, test vectors may be generated by computing device 14 and written to disk, represented by test vector database 12, using the behavioral model or using an actual IC device. Vectors are read from test vector database 12 when an IC device is under test.

Another manner in which test vectors may be used by computing device 14 is through test vector database 12. In this manner, computing device 14 reads the test vectors that are in test vector database 12 over connection 17. Test vector database 12 may indeed be created by computing device 14, hence connection 17 is illustrated as a bi-directional connection.

Device test logic 100 is illustrated in FIG. 1 as residing in both computing device 14 and also within integrated circuit under test 200, which resides within test system 13. Device test logic 100 is shown in this manner because device test logic 100 includes both information that is part of integrated circuit 200 and also a software module that is executed by computing device 14 in order to appropriately test integrated circuit 200.

Computing device 14 communicates over connection 18 with scan interface 19. Scan interface 19 allows computer system 14 access to the test system 13, which contains the integrated circuit under test 200. Scan interface 19 provides computer device 14 a scan interface into the integrated circuit device under test 200. While illustrated as a discrete element, scan interface 19 may reside within computing device 14, may be contained within test system 13, or may indeed be a stand-alone device as depicted in FIG. 1. Scan interface 19 may be a commercially available interface or may be a custom designed device, depending upon application.

Scan interface 19 communicates with test system 13 over connection 21. Test system 13 may be, for example but not limited to, a full test system including scan interface 19, may be a single circuit board housing scannable devices, may be a test head at an integrated circuit test fixture, or may be any other system that allows scan access to the core of the integrated circuit to the device under test 200. Indeed, the connections to the integrated circuit under test 200 may merely be power connections and a four-wire scan interface plus a clock input signal. Indeed, through the use of device test logic 100, the pin count required to gain access to integrated circuit 200 may be limited to the few pins mentioned above. This arrangement is particularly advantageous because it allows the testing to be described herein to be accomplished on a silicon wafer prior to its being packaged as an integrated circuit device.

Figure 2:
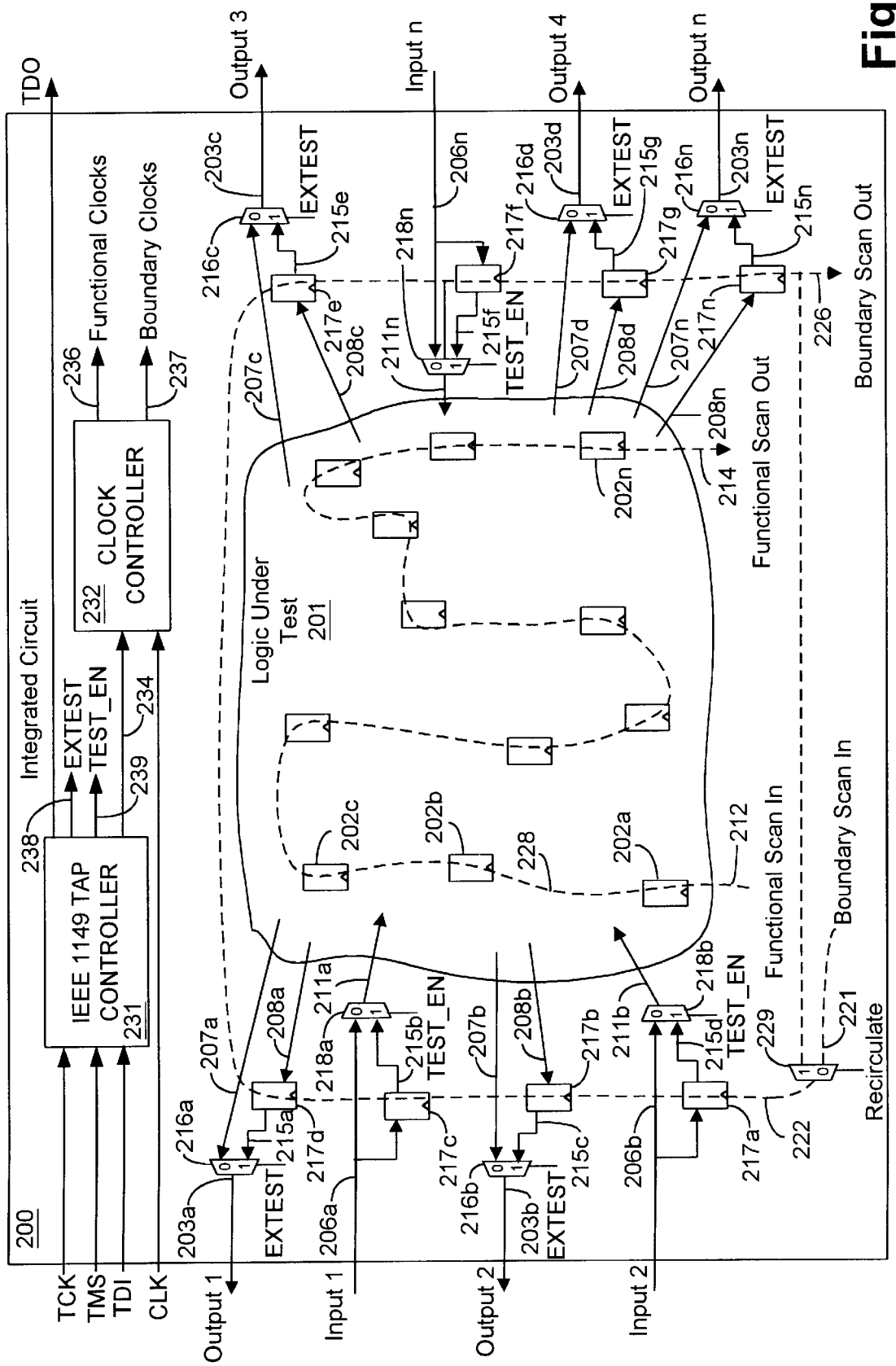
FIG. 2 is a schematic view illustrating the integrated circuit of FIG. 1 including the operation of the device test logic of FIG. 1.

FIG. 2 is a schematic view illustrating the integrated circuit 200 of FIG. 1 including the operation of device test logic 100. Integrated circuit 200 includes logic under test 201. Logic under test 201 may include all of the logic within integrated circuit 200 or only a portion thereof. In one aspect of the present invention, a plurality of logic under test regions 201 located in a single integrated circuit may be tested by using the concepts of the present invention. Logic under test 201 includes a plurality of functional scan registers 202 which are illustrated as residing along functional scan ring 228. Typically, a large number of functional scan registers 202 are included within logic under test 201. It is not uncommon for thousands or tens of thousands of functional scan registers 202 to be contained within logic under test 201. Functional scan access to logic under test 201 is provided over connection 212, while functional scan output information from logic under test 201 is provided over connection 214.

Surrounding logic under test 201 is boundary scan ring 222. Distributed around boundary scan ring 222 are boundary scan registers 217. A plurality of boundary scan registers 217, typically on the order of a few hundred to a thousand registers, comprise boundary scan ring 222. Depending upon the application, some number of boundary scan registers 217 will be used as input boundary scan registers, and some number of boundary scan registers 217 will be used as output boundary scan registers, the input and output boundary scan registers being interleaved to ensure that random data is supplied to the functional scan registers 202. The arrangement depicted in FIG. 2 has all registers, that is boundary scan registers and functional scan registers, located within integrated circuit 200. As will be described in greater detail below, in accordance with an aspect of the invention, the boundary scan registers and functional scan registers will be configured as a shift register, thus allowing information to be written into logic under test 201 and also to be read out of logic under test 201. This arrangement provides scan access to the core logic (logic under test 201) of the integrated circuit device 200 under test, in this instance depicted by logic under test 201.

Although omitted for clarity, boundary scan ring 222 illustratively comes in contact with all of the pins of integrated circuit device 200 and complies with Institute of Electrical and Electronics Engineers (IEEE) standard 1149. IEEE 1149 allows integrated circuit manufacturers the ability to verify opens and shorts at the circuit board level using the boundary ring of the integrated circuit. The boundary scan ring 222 may be on the order of 600–800 scan bits for large devices, and may be on the order of 20–50 scan bits for small devices. This typically represents a 1:1 correlation between the number of signal pins on the integrated circuit device and the number of boundary registers.

Also included are IEEE 1149 tap controller 231 and clock controller 232, the operation of which will be appreciated by those skilled in the art. IEEE tap controller 231 provides the EXTEST and TEST_EN signals over connections 238 and 239 respectively. These signals will be used to control the operation of multiplexers 216 and 218, respectively. IEEE tap controller 231 also provides over connection 234 a group of control signals to clock controller 232. The signals on connection 234 are responsible for starting and stopping the boundary and functional clocks. Furthermore, this control group is responsible for selecting the number of clocks which are to be applied to the boundary and functional registers. Clock controller 232 supplies the functional clocks over connection 236 and the boundary clocks over connection 237.

Illustratively, logic under test 201 receives information through boundary scan ring 222 from a plurality of inputs, and supplies output to boundary scan ring 222 via a plurality of outputs. For example, input 1 on connection 206a is supplied to input boundary scan register 217c and also to multiplexer (mux) 218a. When mux 218a receives a test enable signal "TEST_EN" from IEEE tap controller 231, it will supply the information within input boundary scan register 217c over connection 211a into logic under test 201. In similar fashion, logic under test 201 will supply information to output boundary scan registers as follows. Illustratively, an output is supplied from logic under test 201 over connection 207b directly to mux 216b. The output from logic under test 201 is also supplied over connection 208b to output boundary scan register 217b. Once mux 216b receives the "EXTEST" signal from IEEE tap controller 231, it will supply either the information directly from logic under test 201 over connection 207b over output 203b or will supply the contents of output boundary scan register 217b over connection 203b as output 2. Connections 207, 208 and 211 between boundary scan ring 222 and logic under test 201 may be as follows, as those skilled in the art will appreciate. Although the following will be described using one test input example and one test output example, it should be understood that all registers are functioning as the one to be described hereafter.

For output pins, the normal flow is for data arriving from logic under test 201 over connection 207a to pass through mux 216a and arrive at an output pin over connection 203a. During IEEE extest mode, the EXTEST signal is asserted to mux 216a with the result of connection 203a now being driven from output boundary scan register 217d over connection 215a via mux 216a. Sampling of the logic under test 201 into boundary scan registers 217d occurs through connection 208a.

For input pins, the normal data path is from connection 206a, through mux 218a into logic under test 201 over connection 211a. Sampling of the input pin takes place using input boundary scan register 217c via connection 206a. During IEEE intest mode, or during IC testing, the TEST_EN signal is asserted to mux 218a and the logic under test 201 is now driven by input boundary scan register 217c via connection 215b through mux 218a.

In addition, the boundary scan ring 222 may couple to the functional scan ring 228 either directly via connections between registers, or indirectly, via connections through the core logic.

Furthermore, bi-directional pins may be implemented in which both input and output functions occur over the same pin.

Essentially, mux's 218 and 216 operate in order to switch the output or input signals, for example over connections 206 and 203, respectively, between the input or output of the logic under test 201, for example over connections 211 and 207 respectively, and the input or output of the boundary scan registers 217.

Functional scan ring 228 comes in contact with approximately 99% of the functional scan registers 202 within logic under test 201. The functional scan rings are on the order of tens of thousands or even hundreds of thousands of bits long. Therefore, the functional scan ring 228 has significantly more visibility into the logic under test 201 than does the boundary scan ring 222.

In accordance with the invention, the boundary scan ring provides access to the functional registers, within logic under test 201. In this manner, both the boundary scan registers 217 and functional scan registers 202 can be stimulated with data. Both the boundary scan ring 222 and functional scan ring 228 are initialized with a set of data. Data is loaded into the boundary scan ring 222 over connection 221 and data is loaded into functional scan ring 228 over connection 212. The functional registers are clocked in their normal operation and the boundary scan registers are incrementally clocked, or shifted by one bit position. The boundary scan registers 217 are shifted in lock step with the system clock. The boundary scan registers 217 are clocked in lock step with the system clock via clock controller 232. In this manner, data is shifted through the boundary scan ring 222 in a recirculating fashion through mux 229. New data is presented to the logic under test 201 on every clock cycle from input boundary scan registers 217a, 217c and 217f. The boundary ring 222 is also modified on every clock cycle by data presented from logic under test 201 through connection 208 to boundary scan registers 217b, 217d, 217e, 217g and 217n. A number of clock cycles, preferably two or more, allow the integrated circuit 200 to be tested in a real time operational mode. Information contained in boundary scan registers 217 can be sampled out of the boundary scan ring 222 over connection 226 and, if desired, the information in functional scan registers 202 can be sampled out of the functional scan ring 228 over connection 214 in order determine whether defects are present within the logic under test 201.

The information taken out of the functional scan registers 202 and, if desired, the boundary scan registers 217 is compared against the expected results for the device (which is a known quantity based upon the integrated circuit design), in order to determine whether the particular logic under test 201 is performing as designed. For example, simulation information generated during the design of the integrated circuit device 200 can be used to verify the integrity of the logic under test 201.

To illustrate, assume that both boundary scan ring 222 and functional scan ring 228 are initialized with some known value by serially shifting data into both rings, all the registers within the design are now loaded with some data. Then, to test the logic (201), the integrated circuit 200 is placed in the above-described test mode, by using mux 229 to recirculate data in the boundary scan ring 222 via operation of the recirculate command on connection 227. Then, N number of clocks are issued causing the boundary scan ring 222 to shift N times. Simultaneously therewith and in lock step with the boundary scan ring 222, the functional scan registers 202 are being clocked N times, updating their contents based upon the current state of the logic under test 201. The recirculate command is then deasserted and the data is scanned out of the boundary scan ring 222 via connection 226. This data is then compared against the expected data by computing device 14 in order to determine whether a defect was detected. Data may also be scanned out of the functional ring 228 via connection 214 and tested in similar fashion.

This is repeated until all of the test vectors 12 (FIG. 1) have been operated on integrated circuit 200. The compare operation may be performed via software, hardware, or a combination thereof.

The expected result is represented by the test vectors 12 of FIG. 1. The software running on computing device 14 extracts scan initialization and scan expect data out of the vector file contained in test vector database 12. The compare of the actual scan out data with the expected scan data may be performed in software on computing device 14. Also, the vectors may be generated using a simulation model if the IC, but may also be generated using a sampling of the IC under test by taking a sampling of devices or by taking known good devices.

In operation, boundary scan ring 222 emulates a linear shift register, in that it allows the formation of a stimulus into logic under test 201 to attempt to excite and find defects or faults within the logic under test 201. In this manner, the present invention allows the boundary scan ring 222 to function as a linear shift register, without the necessity of the linear shift register logic being hard coded into the device. In essence, boundary scan ring 222 emulates a linear shift register that can be changed in real time by scanning in or initializing the ring with different information for any test. In this manner, the logic for testing integrated circuit 200 need not be hard coded into the circuitry, or into the silicon itself, but rather may be revised as the integrated circuit is developed, and more defects are found.

FIG. 3 is a flow chart 80 illustrating the vector generation of the device test logic 100 of FIG. 1. In block 81, the test enable signal to mux 218 is enabled. In block 82, the functional scan ring is initialized with some initial data and in block 84, the boundary scan ring 222 is initialized with some initial data.

In block 86, the boundary ring mux 229 of FIG. 2 is enabled with a recirculate command such that the data in the boundary scan registers 217 gets recirculated. As used herein, recirculate means transferring information from one boundary scan register to the next in the boundary scan ring in a continuous loop fashion.

In block 87, at least two clocks pulses are issued by clock controller 232 to the device. In this manner, the logic under test 201 receives clock input signals such that an operational state is simulated. N number of clocks are issued depending upon the simulation or the test results desired. Preferably, at least two clocks are issued because a single clock would be a steady state test, and not representative of a functioning device. To run the device at design speed requires two or more clock inputs.

As stated above, the boundary scan registers 217 are clocked in lock step with the system clock via clock controller 232. In this manner, data is shifted through the boundary scan ring 222 in a recirculating fashion through mux 229. New data is presented to the logic under test 201 on every clock cycle from input boundary scan registers 217a, 217c and 217f. The boundary ring 222 is also modified on every clock cycle by data presented from logic under test 201 through connection 208 to boundary scan registers 217b, 217d, 217e, 217g and 217n. In this manner, a pseudo-random stimulus is being created for the core device.

In block 88, the recirculate command to the boundary ring mux 229 is disabled and in block 89, the data is read out of boundary scan registers 217 over connection 226 and/or the data is read out of functional scan registers 202 over connection 214. Typically, it is desirable to scan data out of the boundary scan registers 217 only, as there are significantly fewer bits therein. In one aspect of the invention, if it is desired to augment device testing, it is possible to also scan data out of the functional scan registers 202. However, because there is significantly more information available from the functional scan ring 228, test coverage significantly improves at the expense of longer test times. Similarly, it is possible to scan data only out of the functional test ring 228.

In block 91 it is determined whether the test coverage is sufficient. If the test coverage is not sufficient, then the boundary scan ring 222 will be re-initialized and/or the functional scan ring 228 will be initialized, and steps 84–89 repeated. If it is determined in block 91 that the test coverage is sufficient, then in block 92 the actual data will be saved to disk (test vector database 12 of FIG. 1) as the expected data and the vector generation process is complete. A vector set is a series of test patterns. One pattern is scan initialization data, some clocking commands, and scan expect data.

The boundary scan ring 222 acts as the pattern generator as it is changing data for every clock tick that the stimulus to the core (logic under test 201) changes because it is capturing new values and shifting data every clock cycle. Boundary scan ring 222 also acts as a signature analysis register, whereas for every clock tick it captures new data from the logic under test 201.

FIG. 4 is a flow chart illustrating the operation of device test logic 100 with respect to device testing. In block 101, the patterns saved to disk in step 92 of FIG. 3 are read from the disk and the test enable signal to mux's 218 is enabled.

In block 102, the functional scan ring 228 is initialized with some initial data and in block 104, the boundary scan ring is initialized with some data, as described above with respect to FIG. 3.

In block 106, the boundary ring mux 229 of FIG. 2 is enabled with the recirculate command and in block 107, preferably two clock signals are issued. The number of clocks is determined by the contents of the pattern read from the disk.

In block 108, the recirculate command to the boundary ring mux 229 is disabled, and in block 109, the information contained in boundary scan registers 217 is read out over connection 224 and, if desired the information contained in functional scan registers 202 is read out over connection 214.

In one aspect of the invention, it is desirable to restrict testing to the boundary scan registers only. In this manner, data can be scanned out of the boundary scan registers 217 and compared against the expected result. Advantageously, the present invention allows the signature analysis and the automatic test pattern generation to be continuously variable, without hard coding into the silicon. In this manner, testing can continuously be improved to maximize test coverage and/or reduce test time.)

Another manner in which test coverage may be increased is for the user to simply increase the pattern count or the clock count. Furthermore, test coverage may also be increased by initializing the functional ring more often and/or scanning results from the functional ring more often. Remember, functional scan operations should be minimized in order to reduce test time. Generally, the user would use commercially available tools to determine the current level of fault coverage. The information provided by the present invention will help determine whether additional patterns are needed or if different initialization/scan reads are needed.

In block 111, it is determined whether the actual results read from the boundary scan registers 217 and, if desired, from the functional scan registers 202 match the expected results. If the actual data does not match the expected data, then in block 112 the device is reported as being failed and the process is complete. If in block 111 it is determined that the actual results read from the boundary scan registers and, if desired the functional scan registers are as expected, then it is determined in block 114 whether the pattern tested was the last test pattern. If it is determined that the last pattern has been tested, then the process is complete. If it is determined that there is an additional pattern to test, then the process returns to either block 104 where the boundary scan ring 222 is reinitialized and/or block 102 where the functional scan ring 228 is reinitialized. The process then goes through steps 104–111 again until the last pattern has been tested.

It will be apparent to those skilled in the art that many modifications and variations may be made to the preferred embodiments of the present invention, as set forth above, without departing substantially from the principles of the present invention. For example, the present invention can be used to test any integrated circuit device. All such modifications and variations are intended to be included herein within the scope of the present invention, as defined in the claims that follow.

What is claimed is:

1. A system for testing an integrated circuit, the integrated circuit including core logic comprising:

a boundary scan ring, said boundary scan ring including a plurality of registers, said boundary scan ring being dynamically configurable for any of a plurality of test configurations;

a functional scan ring within said integrated circuit, said functional scan ring including a plurality of registers, said functional scan ring coupled to said boundary scan ring;

multiplexer logic configured to control said boundary scan ring such that said boundary scan ring recirculates data within said boundary scan registers; and clock logic configured to shift said boundary scan registers with a test clock signal while said functional scan registers capture data supplied by said boundary scan registers, and said boundary scan registers capture data from said functional scan registers, thereby modifying said boundary scan registers with data from said functional scan registers on each clock signal.

2. The system of claim 1, wherein said boundary scan ring further comprises a plurality of inputs and a plurality of outputs connected directly to said functional scan ring.

3. The system of claim 1, wherein said boundary scan ring further comprises a plurality of inputs and a plurality of outputs connected to said functional scan ring through said core logic.

4. The system of claim 1, wherein said multiplexer logic is configured to shift said boundary registers with each said clock signal.

5. The system of claim 1, further comprising logic configured to scan data into said boundary scan registers.

6. The system of claim 1, further comprising logic configured to scan data out of said boundary scan registers.

7. The system of claim 1, further comprising logic configured to scan data into said functional scan registers.

8. The system of claim 1, further comprising logic configured to scan data out of said functional scan registers.

9. A method for testing an integrated circuit, the integrated circuit including core logic and a plurality of functional scan registers coupled to a plurality of boundary scan registers, the method comprising the steps of:

establishing a plurality of test vectors;

initializing said functional scan registers and said boundary scan registers, said boundary scan registers being dynamically configurable for any of a plurality of test configurations;

clocking said integrated circuit so that said boundary scan registers are shifted on each clock pulse while said functional scan registers capture data from said boundary scan registers;

supplying data input signals from said boundary scan registers to said functional scan registers;

receiving in said boundary scan registers data output signals from said functional scan registers, thereby modifying said boundary scan registers with data from said functional scan registers on each clock signal; and outputting said data output signals and comparing said data output signals to said test vectors in order to determine whether said data output signals are an accurate representation of said test vectors.

10. The method of claim 9, further comprising the step of directly connecting said plurality of boundary scan registers to said plurality of functional scan registers.

11. The method of claim 9, further comprising the step of connecting said plurality of boundary scan registers to said plurality of functional scan registers through said core logic.

12. The method of claim 9, wherein said clocking step further comprises at least one clock signal.

13. The method of claim 9, wherein said outputting step comprises outputting data from said boundary scan registers.

14. The method of claim 9, wherein said outputting step comprises outputting data from said functional scan registers.

15. The method of claim 9, wherein said data used in said comparing step is obtained from said boundary scan registers.

16. The method of claim 9, wherein said data used in said comparing step is obtained from said functional scan registers.

17. A computer readable medium having a program for testing an integrated circuit, the integrated circuit including core logic and a plurality of functional scan registers coupled to a plurality of boundary scan registers, the program including logic for performing the steps of:

establishing a plurality of test vectors;

initializing said functional scan registers and said boundary scan registers, said boundary scan registers being dynamically configurable for any of a plurality of test configurations;

clocking said integrated circuit so that said boundary scan registers are shifted on each clock pulse while said functional scan registers capture data from said boundary scan registers;

supplying data input signals from said boundary scan registers to said functional scan registers;

receiving in said boundary scan registers data output signals from said functional scan registers, thereby modifying said boundary scan registers with data from said functional scan registers on each clock signal; and outputting said data output signals and comparing said data output signals to said test vectors in order to determine whether said data output signals are an accurate representation of said test vectors.

18. The program of claim 17, further comprising logic for performing the step of directly connecting said plurality of boundary scan registers to said plurality of functional scan registers.

19. The program of claim 17, further comprising logic for performing the step of connecting said plurality of boundary scan registers to said plurality of functional scan registers through said core logic.

20. The program of claim 17, wherein said clocking step further comprises at least one clock signal.

21. The program of claim 17, wherein said outputting step further comprises outputting data from said boundary scan registers.

22. The program of claim 17, wherein said outputting step further comprises outputting data from said functional scan registers.

23. The program of claim 17, wherein said data used in said comparing step is obtained from said boundary scan registers.

24. The program of claim 17, wherein said data used in said comparing step is obtained from said functional scan registers.

* * * * *